(12) United States Patent
Nanami (10) Patent No.: US 12,308,328 B2
(45) Date of Patent: May 20, 2025

(54) SEMICONDUCTOR MEMORY DEVICE AND METHOD FOR MANUFACTURING THE SAME

(71) Applicant: Kioxia Corporation, Tokyo (JP)

(72) Inventor: Kyosuke Nanami, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 967 days.

(21) Appl. No.: 17/345,184

(22) Filed: Jun. 11, 2021

(65) Prior Publication Data

US 2022/0084957 A1 Mar. 17, 2022

(30) Foreign Application Priority Data

Sep. 11, 2020 (JP) .................... 2020-153342

(51) Int. Cl.
| | |
|---|---|
| *H10B 41/00* | (2023.01) |
| *H01L 21/768* | (2006.01) |
| *H01L 23/00* | (2006.01) |
| *H01L 23/522* | (2006.01) |
| *H01L 23/528* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ...... *H01L 23/562* (2013.01); *H01L 21/76816* (2013.01); *H01L 21/76877* (2013.01); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02)

(58) Field of Classification Search
CPC ........ H10B 41/27; H10B 41/10; H10B 43/27; H10B 43/10
See application file for complete search history.

(56) References Cited

U.S. PATENT DOCUMENTS

| | | | |
|---|---|---|---|
| 10,290,595 B2 | 5/2019 | Oshiki | |
| 2015/0303214 A1 | 10/2015 | Kim et al. | |
| 2019/0287995 A1 | 9/2019 | Oike et al. | |
| 2019/0371811 A1 | 12/2019 | Oike | |
| 2019/0393236 A1* | 12/2019 | Kaneko | H10B 43/50 |

FOREIGN PATENT DOCUMENTS

| | | |
|---|---|---|
| JP | 2018-160531 A | 10/2018 |
| JP | 2019-161059 A | 9/2019 |
| JP | 2019-212689 A | 12/2019 |

OTHER PUBLICATIONS

Xiao, H., "Introduction to semiconductor technology"—$2^{nd}$ Edition, SPIE Press, 2012, pp. 654-655 with cover pages.

* cited by examiner

*Primary Examiner* — Reema Patel
(74) *Attorney, Agent, or Firm* — Oblon, McClelland, Maier & Neustadt, L.L.P.

(57) ABSTRACT

A semiconductor memory device according to an embodiment includes: a stacked body in which a plurality of conductive layers and a plurality of insulating layers are alternately stacked one by one; and a plurality of first plate-like portions that penetrate the stacked body in a stacking direction thereof and cross the stacked body in a first direction intersecting the stacking direction, the plurality of first plate-like portions being arranged along the first direction with a gap therebetween.

9 Claims, 11 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No.: 2020-153342, filed on Sep. 11, 2020; the entire contents of which are incorporated herein by reference.

FIELD

Embodiments described herein relate generally to a semiconductor memory device and a method for manufacturing the same.

BACKGROUND

For example, a semiconductor memory device with a three-dimensional structure has a stacked body in which a plurality of conductive layers and a plurality of insulating layers are alternately stacked one by one, and a memory pillar that penetrates the stacked body and is provided with a plurality of memory cells along a stacking direction of the stacked body. In the semiconductor memory device, the plurality of conductive layers function as word lines of memory cells. In addition, an end portion of the stacked body is formed in a staircase shape having each conductive layer as a step surface, and a contact is connected to the conductive layer as the step surface. The staircase shape tends to be provided not at the end portion of the stacked body but at a center portion of a memory cell region where the memory pillar is formed in order to lower the resistance of the word line and speed up the operation of the semiconductor memory device.

On the other hand, a peripheral circuit that controls each memory cell tends to be provided below the memory cell region. This is to reduce a chip area while avoiding reduction in the storage capacity. In this case, a through contact connecting the peripheral circuit and a wiring above the memory cell region is provided so as to penetrate an insulating portion provided in the memory cell region.

For this reason, in the memory cell region, the stacked body of the conductive layers and the insulating layers and the insulating portion with no conductive layer are mixed. When the insulating portion and the stacked body are mixed, the insulating portion and the stacked body may be deformed by stress due to a difference in materials.

DETAILED DESCRIPTION

A semiconductor memory device according to an embodiment includes: a stacked body in which a plurality of conductive layers and a plurality of insulating layers are alternately stacked one by one; and a plurality of first plate-like portions that penetrate the stacked body in a stacking direction thereof and cross the stacked body in a first direction intersecting the stacking direction, the plurality of first plate-like portions being arranged along the first direction with a gap therebetween.

Hereinafter, non-limiting exemplary embodiments of the present invention will be described with reference to the accompanying drawings. In all the accompanying drawings, the same or corresponding members or parts are denoted by the same or corresponding reference numerals, and redundant description is omitted. Further, since the drawings are not intended to illustrate relative ratios between members or parts or between the thicknesses of various layers, specific thicknesses and dimensions should be determined by those skilled in the art in light of the following non-limiting embodiments.

Figure 1:
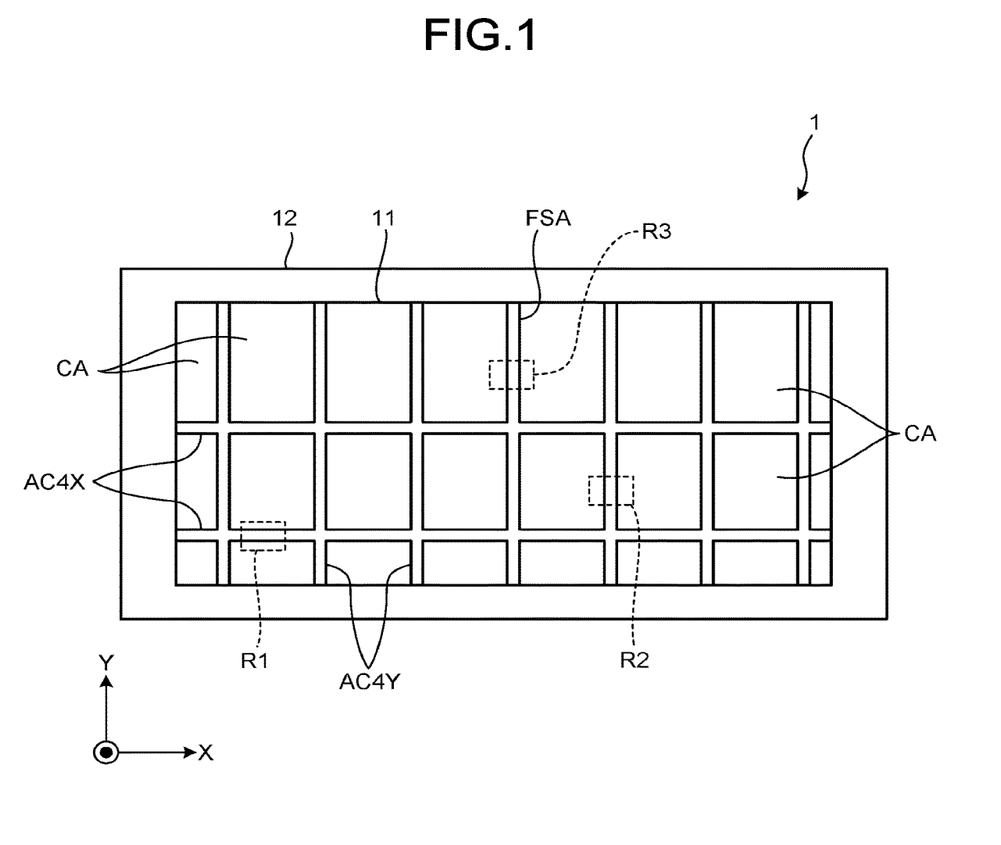
FIG. 1 is a top view illustrating an example of a semiconductor memory device according to an embodiment.

FIG. 1 is a top view illustrating an example of a semiconductor memory device according to an embodiment; As illustrated, a semiconductor memory device 1 has a memory region 11 and a peripheral region 12 surrounding the memory region. Further, as described later, a peripheral circuit that controls each memory cell such as a row decoder circuit and a sense amplifier is provided at least below the memory region 11.

The memory region 11 has through contact regions AC4X and AC4Y, cell regions CA, and a staircase region FSA. The through contact region AC4X extends along an X-axis direction to be a longitudinal direction (first direction) of the semiconductor memory device 1, and the through contact region AC4Y extends in a Y-axis direction to be a lateral direction (second direction). Further, the staircase region FSA is located substantially at the center of the memory region 11 in the X-axis direction and extends along the Y-axis direction.

The cell region CA is surrounded by the through contact regions AC4X and AC4Y and the staircase region FSA. A plurality of memory cells are three-dimensionally disposed in the cell region CA. Specifically, the cell region CA has a stacked body SK (see FIG. 4A and the like) in which a plurality of conductive layers and a plurality of insulating layers are alternately stacked one by one, and a plurality of memory pillars that penetrate the stacked body SK along a Z-axis direction to be a stacking direction of the stacked body SK. As will be described later, the memory pillar is provided with a plurality of memory cells along the stacking direction. Further, the conductive layer of the stacked body SK functions as a word line of the memory cell.

Figure 2A:
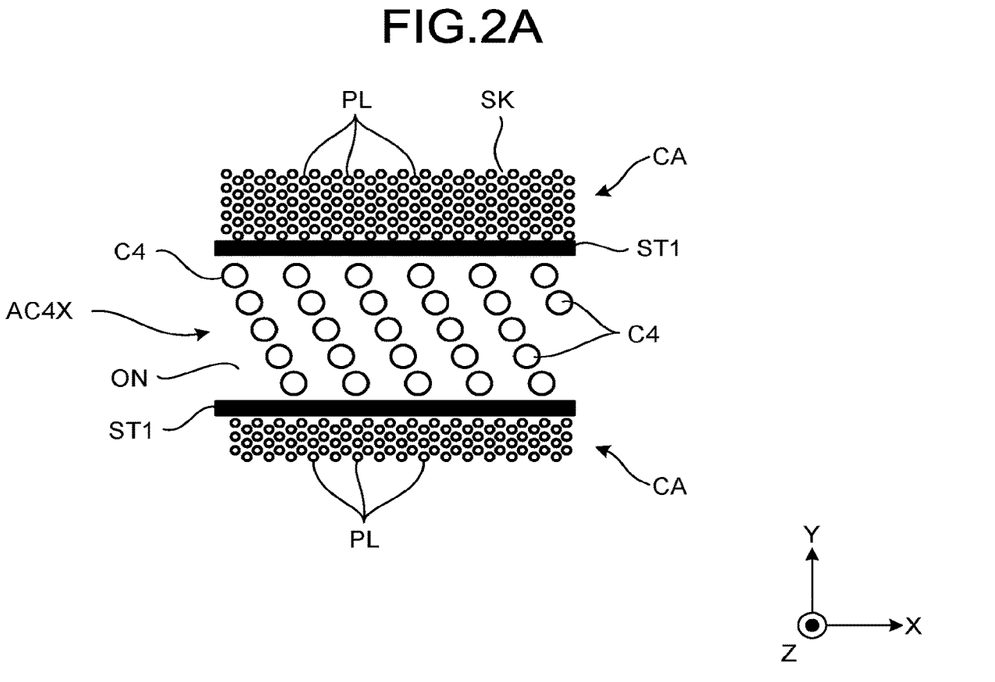
FIG. 2A is a top view schematically illustrating a through contact region extending in a longitudinal direction of a memory region of the semiconductor memory device according to the embodiment.
Figure 2B:
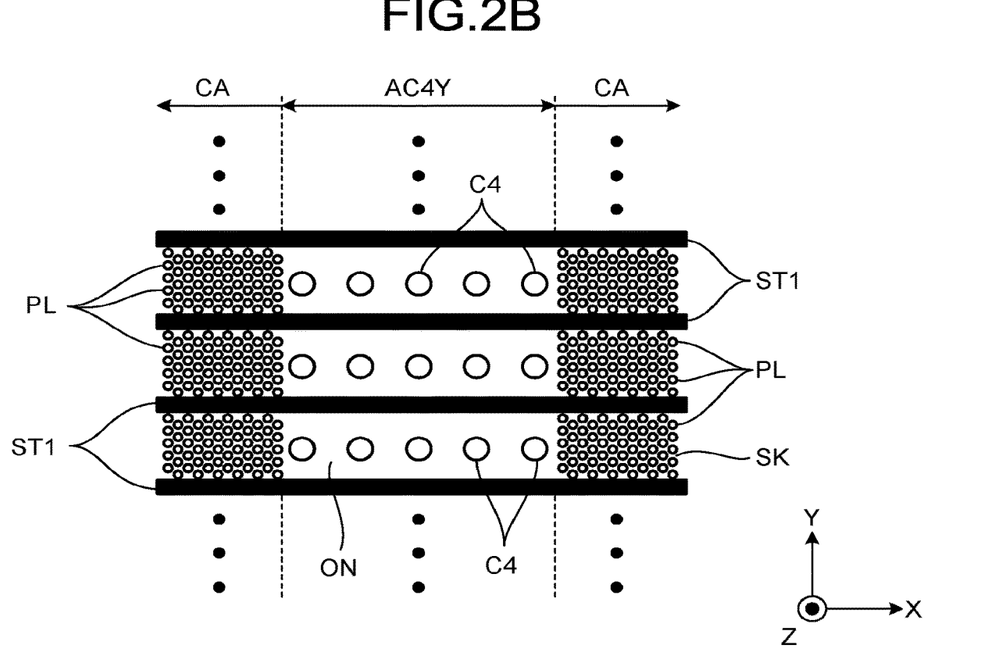
FIG. 2B is a top view schematically illustrating a through contact region extending in a lateral direction of the memory region.

Next, the through contact regions AC4X and AC4Y will be described with reference to FIGS. 2A and 2B. FIG. 2A is a top view schematically illustrating the through contact region AC4X of the memory region 11, and corresponds to, for example, a region R1 in FIG. 1. FIG. 2B is a top view schematically illustrating the through contact region AC4Y of the memory region 11, and corresponds to, for example, a region R2 in FIG. 1.

Referring to FIG. 2A, the through contact region AC4X is partitioned from the cell regions CA by first slits (third plate-like portions) ST1. Further, the through contact region AC4X has a stacked body ON in which different insulating layers are alternately stacked one by one in the Z-axis direction in the drawing, and through contacts (conductor portions) C4 that penetrate the stacked body ON in the Z-axis direction. The through contact C4 is formed of a metal such as tungsten or molybdenum, for example. The through contact C4 is provided to electrically connect a peripheral circuit provided below the cell region CA to, for example, a memory cell in the cell region CA.

Note that the first slits ST1 extend along the X-axis direction at predetermined intervals in the Y-axis direction over the entire memory region 11, and divide the memory cells in the cell region CA into memory blocks. Further, the first slits ST1 are formed by etching the stacked body ON in the manufacturing process of the semiconductor memory device 1, and are then filled with an insulating material such as silicon oxide. In the following description, both a case where the inside is a cavity and a case where the inside has an insulating material are referred to as the first slits ST1 for convenience. Note that the first slit ST1 may be filled with a conductive material. As a result, the first slit ST1 can be used as a wiring. In this case, after a liner layer made of an insulating material is formed on an inner surface of the first slit ST1, a conductive material is further filled inside.

Next, referring to FIG. 2B, the through contact region AC4Y is partitioned by the two cell regions CA and extends along the Y-axis direction so as to cross the first slit ST1. The through contact region AC4Y also has a stacked body ON and through contacts C4 penetrating the stacked body ON. Note that the arrangement of the through contacts C4 in the through contact regions AC4X and AC4Y is not limited to the illustrated example, and may be appropriately determined.

Figure 3:
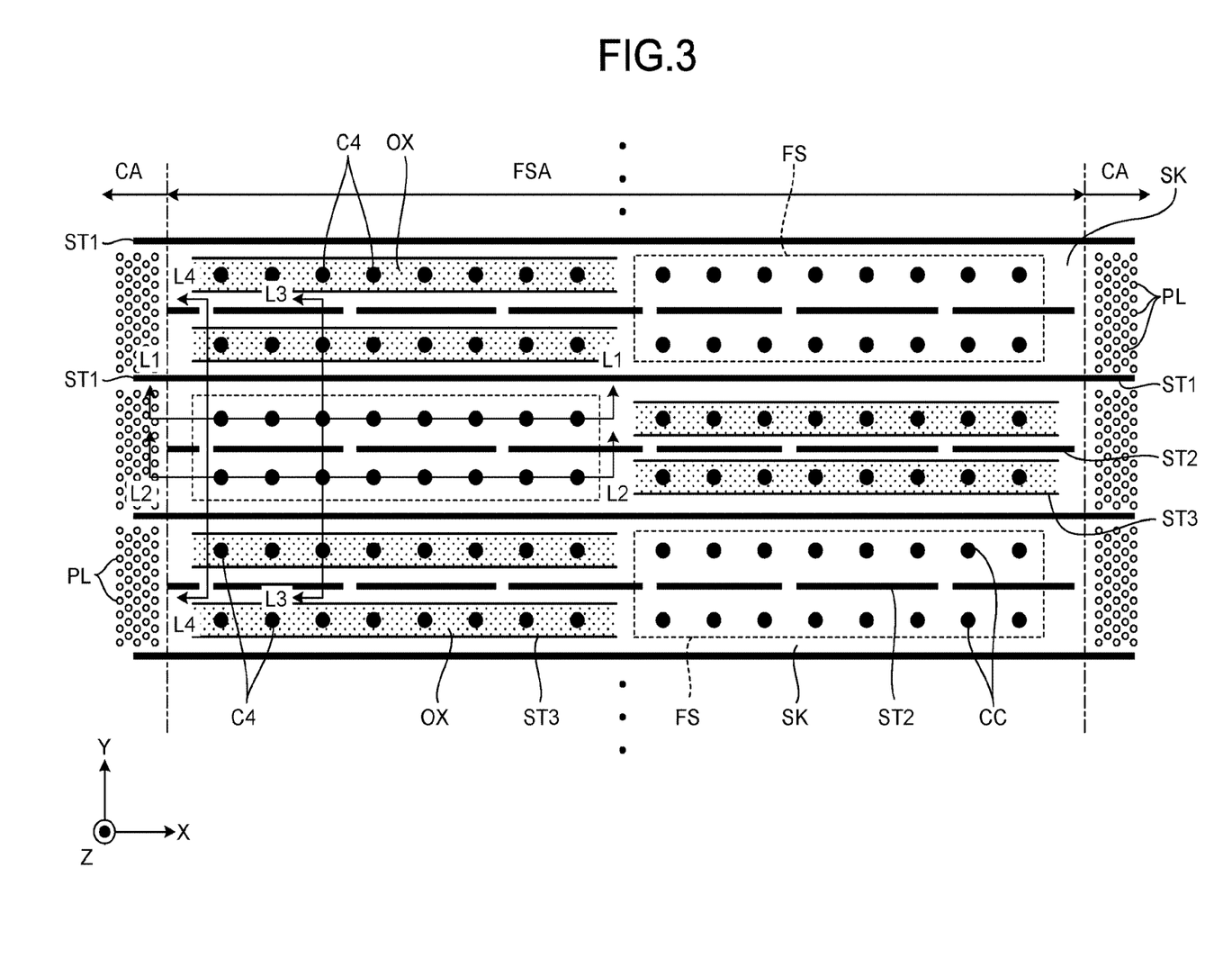
FIG. 3 is a top view schematically illustrating a staircase region of the semiconductor memory device according to the embodiment.

Next, the staircase region FSA will be described with reference to FIG. 3. FIG. 3 is a top view schematically illustrating the staircase region FSA, and corresponds to, for example, a region R3 illustrated in FIG. 1. Similarly to the through contact region AC4Y, the staircase region FSA is partitioned by the two cell regions CA and extends in the Y-axis direction. However, unlike the through contact regions AC4X and AC4Y, the staircase region FSA has contacts CC in addition to the through contacts C4. Further, the staircase region FSA has a staircase portion FS having a staircase shape and an insulating portion OX having a stacked structure, the contacts CC are disposed in the staircase portion FS, and the through contacts C4 are disposed in the insulating portion OX. The staircase portion FS and the insulating portion OX are arranged in the X-axis direction, in a region called a block sandwiched between two adjacent first slits ST1. Further, the staircase portion FS and the insulating portion OX are alternately disposed in the Y-axis direction.

The staircase portion FS has a staircase shape in which the conductive layer of the stacked body SK extending from the cell region CA becomes a step surface corresponding to a terrace portion. The contact CC is connected to the step surface of each step of the staircase portion FS. As described above, since the conductive layer functions as a word line of the memory cell of the cell region CA, the contact CC functions as a lead line of the word line.

Further, in the staircase region FSA, a plurality of second slits (first plate-like portions) ST2 arranged along the X-axis direction with a gap G therebetween are provided substantially at the center of the first slit ST1 in the Y-axis direction. Each of the second slits ST2 is shorter than the first slit ST1. The second slit ST2 is filled with an insulating material such as silicon oxide.

Figure 4A:
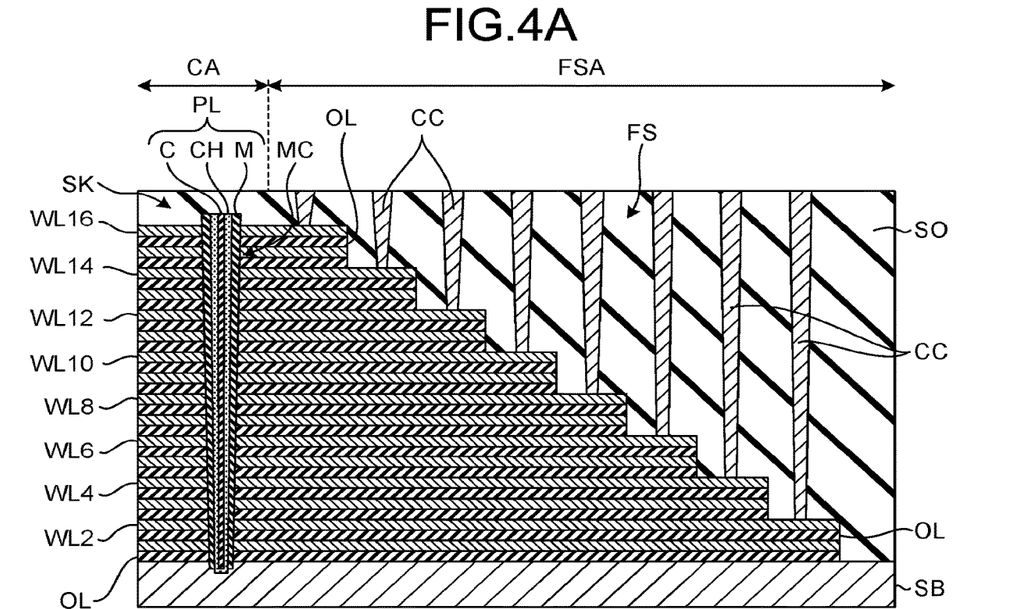
FIG. 4A is a cross-sectional view taken along the line L1-L1 in FIG. 3.
Figure 5:
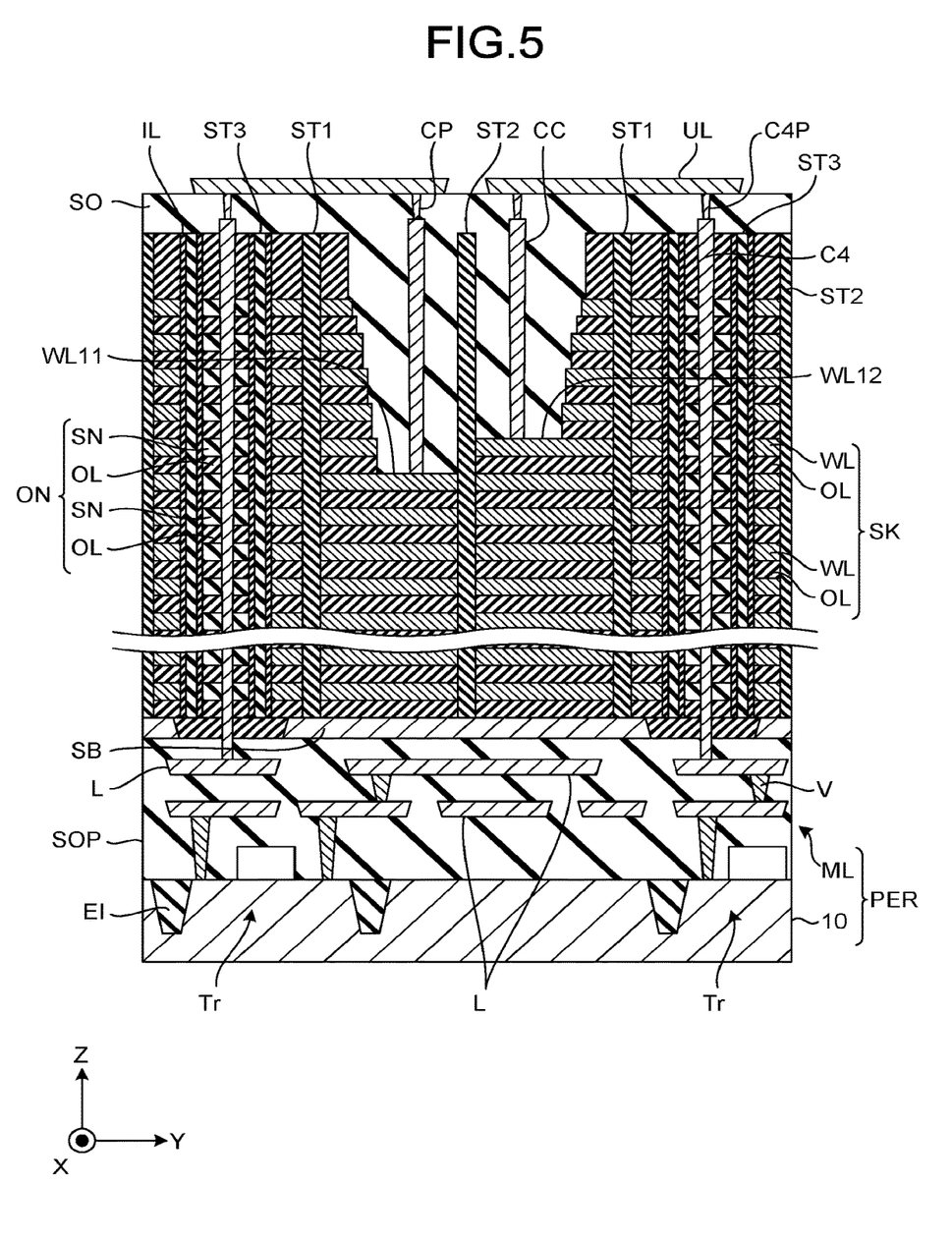
FIG. 5 is a cross-sectional view taken along the line L3-L3 in FIG. 3.
Figure 6:
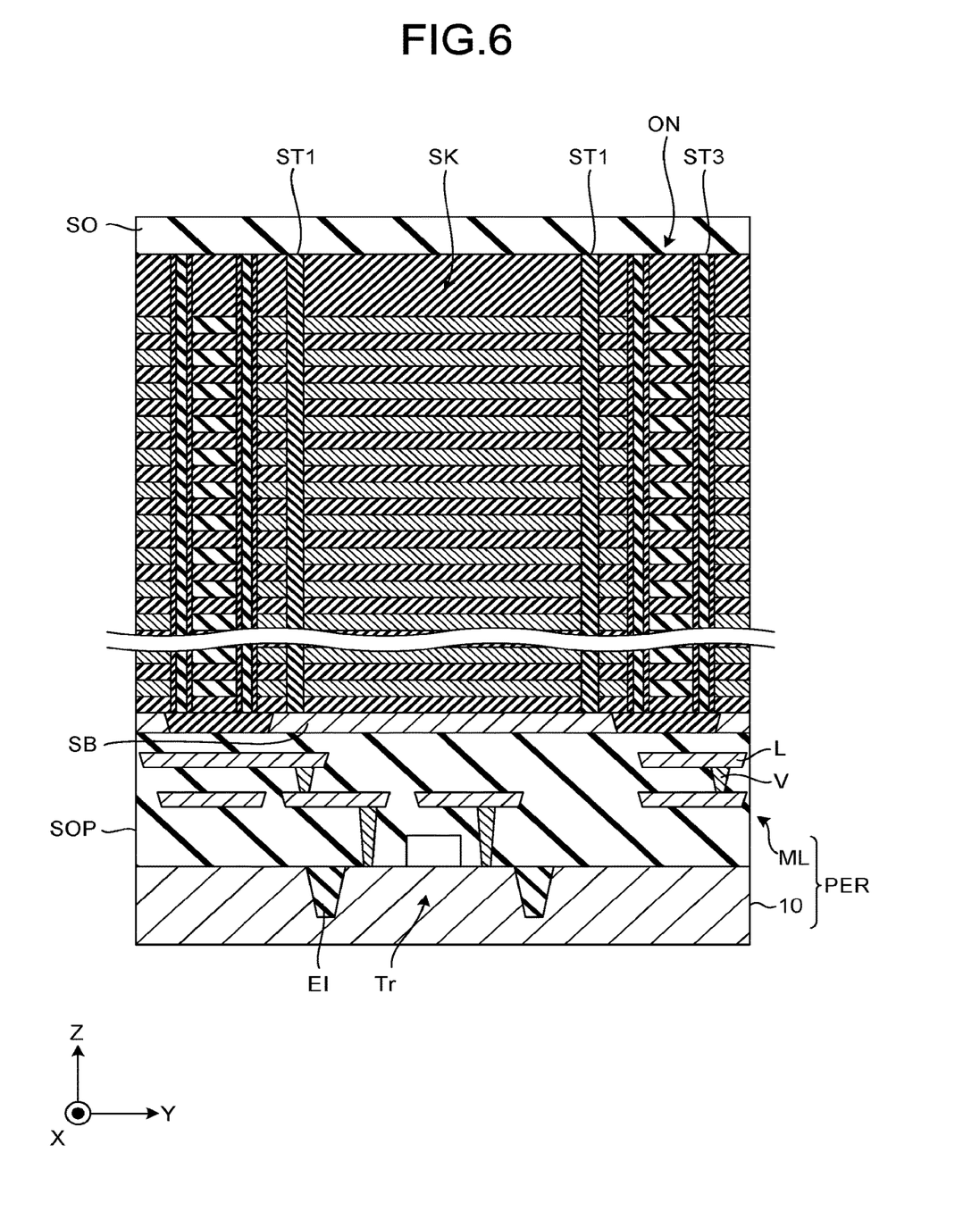
FIG. 6 is a cross-sectional view taken along the line L4-L4 in FIG. 3.

Hereinafter, a structure of the second slit ST2 and its surrounding portion will be described with reference to FIGS. 4A to 6. FIG. 4A is a cross-sectional view taken along the line L1-L1 in FIG. 3, FIG. 4B is a cross-sectional view taken along the line L2-L2 in FIG. 3, FIG. 5 is a cross-sectional view taken along the line L3-L3 in FIG. 3, and FIG. 6 is a cross-sectional view taken along the line L4-L4 in FIG. 3.

Referring to FIG. 4A, the stacked body (second stacked body) SK is formed on a base layer SB formed of a semiconductor such as silicon or a conductor, for example. The stacked body SK has a plurality of insulating layers (second insulating layers) OL and a plurality of conductive layers WL alternately stacked one by one. The insulating layer OL is formed of an insulating material, and is formed of, for example, silicon oxide in the present embodiment. In the following description, the insulating layer OL is referred to as a silicon oxide layer OL. Further, the conductive layer WL may be formed of, for example, a metal such as tungsten or molybdenum. In FIG. 4A, the staircase portion FS has conductive layers WL2, WL4, WL6, . . . , and WL16 as step surfaces. When an individual conductive layer is not mentioned, the conductive layers are collectively referred to as a conductive layer WL. An interlayer insulating film SO formed of an insulating material such as silicon oxide is formed above the staircase portion FS. In addition, the contacts CC penetrating the interlayer insulating film SO are connected to the conductive layers WL2, WL4, WL6, . . . , and WL16. The contact CC is connected to a plug to be described later at an upper end, and the plug is connected to an upper layer wiring. The upper layer wiring can be connected to the through contact C4, for example. As a result, the memory cell and the peripheral circuit are electrically connected via the conductive layer WL functioning as the word line, the contact CC, the plug, the upper layer wiring, and the through contact C4.

In addition, as illustrated in FIG. 4A, in the cell region CA adjacent to the staircase region FSA, a memory pillar PL penetrating the stacked body SK and reaching the base layer SB is provided. The same is applied to FIG. 4B. The memory pillar PL has a columnar shape and includes a memory film M, a channel layer CH, and a core layer C sequentially formed from the outer periphery toward the center. The memory cell MC is formed in a portion where the conductive layer WL of the stacked body SK and the memory film M are in contact with each other.

Figure 4B:
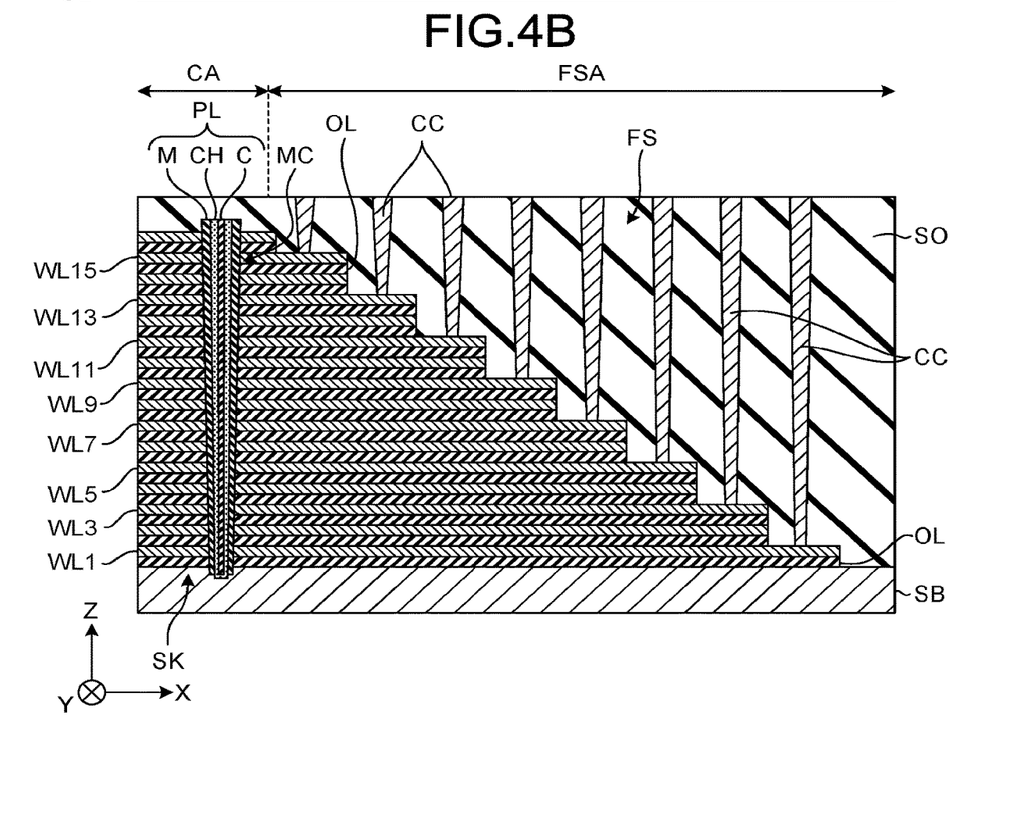
FIG. 4B is a cross-sectional view taken along the line L2-L2 in FIG. 3.

FIG. 4B is a cross-sectional view taken along the X-axis direction on the opposite side across the second slit ST2 of the same staircase portion FS as the staircase portion FS illustrated in FIG. 4A, and the stacked body SK has a staircase shape with the conductive layer WL as a step surface. However, here, the conductive layers WL1, WL3, WL5, . . . , and WL15 become step surfaces, and the contacts CC penetrating the interlayer insulating film SO are connected to the conductive layers. That is, in the semiconductor memory device 1 according to the present embodiment, the step surfaces of the staircase portion FS are different by one step each on both sides of the second slit ST2. In addition, the contacts CC connected to the respective conductive layers WL are arranged in the X-axis direction on both sides of the second slit ST2. In other words, the contacts CC are arranged in two lines with the second slit ST2 interposed therebetween.

Referring to FIG. 5, a multilayer wiring portion ML is formed on a substrate 10 formed of a semiconductor such as silicon, for example. A transistor Tr separated by an element separation layer EI is formed in the substrate 10, and a wiring L and a via V formed in a silicon oxide film SOP are provided in the multilayer wiring portion ML. The transistor Tr formed in a boundary region between the multilayer wiring portion ML and the substrate 10, and the wiring L and the via V in the multilayer wiring portion ML constitute a peripheral circuit unit PER. In addition, the base layer SB is formed on the multilayer wiring portion ML, and the stacked body SK is formed on the base layer SB.

The first slit ST1 and the second slit ST2 penetrate the stacked body SK and reach the base layer SB. Both sides of the second slit ST2 at the center in the drawing are the staircase portion FS, and in the illustrated example, the conductive layer WL11 becomes the step surface on the left side of the second slit ST2, and the contact CC is connected to the conductive layer WL11. On the other hand, on the right side of the second slit ST2, the conductive layer WL12 becomes the step surface, and the contact CC is connected to the conductive layer WL12.

In addition, the insulating portion OX is disposed on the opposite side of the staircase portion FS across the first slit ST1. The insulating portion OX is partitioned by two adjacent third slits (second plate-like portions) ST3, and is configured by the stacked body (first stacked body) ON. The stacked body ON is formed by two different insulating layers alternately stacked one by one. In the present embodiment, one of the two different insulating layers is formed of the silicon oxide layer OL, and the other is formed of a silicon nitride layer (first insulating layer) SN.

The through contact C4 is provided so as to penetrate the stacked body ON constituting the insulating portion OX. The through contact C4 is electrically connected to the wiring L of the peripheral circuit unit PER at the lower end, and is further electrically connected to the transistor Tr of the peripheral circuit unit PER through the via V and the like. Since the entire stacked body ON has an insulating property, the through contact C4 is insulated from the conductive layer WL of the surrounding stacked body SK by the stacked body ON. In addition, the through contact C4 is connected to an upper wiring UL via a plug C4P at the upper end thereof, and the upper wiring UL is electrically connected to the contact CC via the plug C4P. Since the contact CC is electrically connected to the memory cell through the conductive layer WL, the transistor Tr of the peripheral circuit unit PER and the memory cell are electrically connected by such a configuration.

FIG. 6 is a cross-sectional view taken along the line L4-L4 in FIG. 3 as described above. Since the line L4-L4 passes through the gap G of the second slit ST2, the second slit ST2 is not illustrated in FIG. 6. That is, in the gap G of the second slit ST2, the stacked body SK continuously extends in an XY plane. Therefore, the conductive layer WL in the stacked body SK is also electrically continuous in a block which is a region between the two first slits ST1. Therefore, for example, the contact CC connected to the conductive layer WL11 illustrated in FIG. 5 is also electrically conducted to the conductive layer WL11 on the left side of the second slit ST2. As described above, the conductive layer WL corresponds to the word line of the memory cell in the cell region CA. That is, the memory cell in the region between the two adjacent first slits ST1 is controlled by the contact CC provided on either side of the second slit ST2.

Next, a method for forming the conductive layer WL connected on both sides of the second slit ST2 in the gap G of the second slit ST2 will be described with reference to FIGS. 7A to 7D. Note that an outline of a manufacturing process of the semiconductor memory device 1 until the conductive layer WL is formed is as follows.

First, the peripheral circuit unit PER described above is formed on a semiconductor wafer such as a silicon wafer. Next, the base layer SB is formed on the peripheral circuit unit PER, and a stacked body having a configuration similar to that of the above-described stacked body ON in which a plurality of silicon oxide layers OL and a plurality of silicon nitride layers (sacrificial layers) SN are alternately stacked one by one is formed on the base layer SB. Next, a resist mask having an opening at a position where the staircase portion FS is to be formed is provided on a top surface of the stacked body, and the stacked body has a staircase shape through processes including etching, slimming of the resist mask, and re-etching. Subsequently, an etching mask is provided so that about half of each step of the staircase shape is covered and the remaining half is exposed, and etching is performed using the etching mask, so that a provisional staircase portion having steps different by one step each is obtained. Thereafter, for example, a silicon oxide film is deposited so as to cover the provisional staircase portion and the stacked body. Next, the silicon oxide film is planarized to obtain the interlayer insulating film SO (FIGS. 4A and 4B). Subsequently, a plurality of memory pillars (first columnar bodies) PL (FIG. 3) penetrating the stacked body are formed in the cell region CA (FIG. 1). The memory pillar PL is formed, for example, by forming a memory hole that penetrates the stacked body and reaches the base layer SB, and sequentially forming a memory film, a channel layer, and a core layer on the inner surface of the memory hole.

Next, the first slit ST1, the second slit ST2, and the third slit ST3 are formed at predetermined positions by a photolithography process and an etching process, respectively. Subsequently, for example, a silicon oxide film is formed on the inner surfaces of the first slit ST1 to the third slit ST3, and then the silicon oxide film on the inner surfaces of the first slit ST1 and the second slit ST2 is removed by the photolithography process and the etching process. As a result, the stacked body ON and the interlayer insulating film SO are exposed on the inner surfaces of the first slit ST1 and the second slit ST2. On the other hand, the silicon oxide film remains on the inner surface of the third slit ST3.

Next, an etching solution capable of dissolving silicon nitride is injected from the first slit ST1 to the third slit ST3. Examples of the etching solution include phosphoric acid ($H_3PO_4$).

Figure 7A:
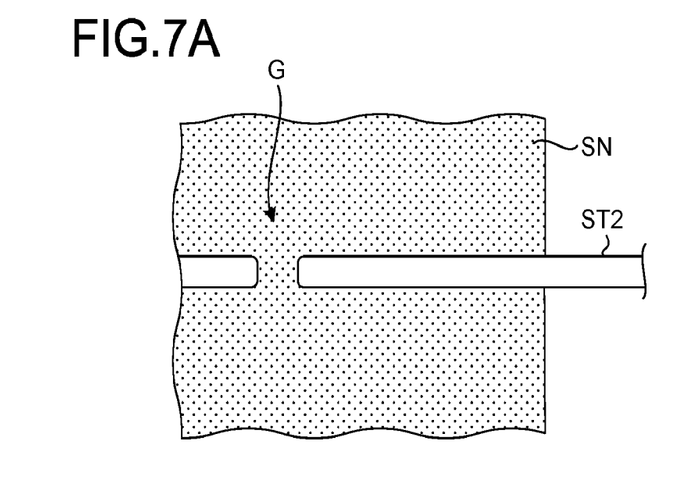
FIGS. 7A to 7D are top views illustrating a process of replacing a silicon nitride layer with a conductive layer.
Figure 7B:
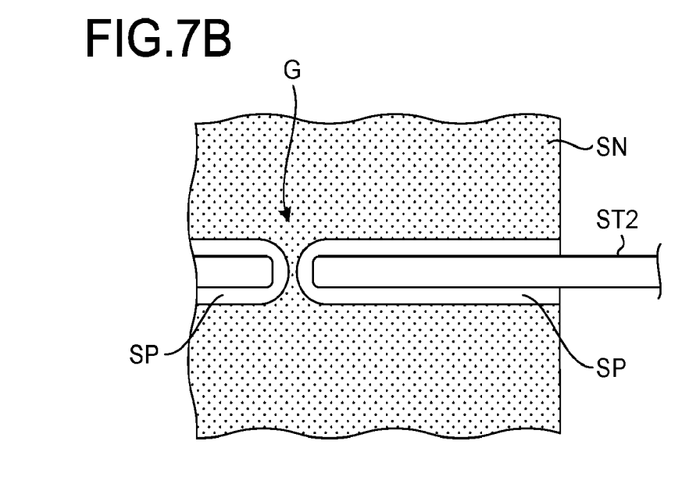
Figure 7C:
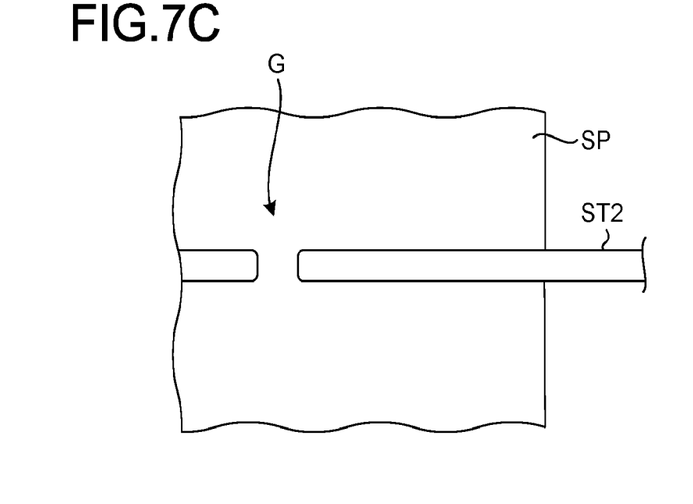
Figure 7D:
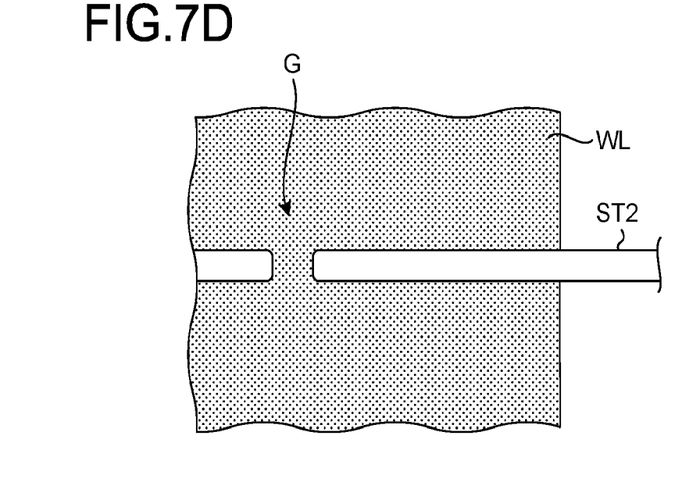

FIG. 7A is a top view schematically illustrating one silicon nitride layer SN in the above-described provisional staircase portion and the second slit ST2. When the etching solution is injected from the second slit ST2, the silicon nitride layer SN exposed to the inner surface of the second slit ST2 is exposed to the etching solution and etched as illustrated in FIG. 7B to generate a space SP. When the etching further progresses, the entire silicon nitride layer SN is removed, and the space SP expands. Here, since the silicon nitride layer SN existing in the gap G of the second slit ST2 is also etched, as illustrated in FIG. 7C, the space SP not only expands to one side and the other side of the second slit ST2 but also continues on both sides through the gap G. Thereafter, the space SP is filled with a metal such as tungsten or molybdenum through the second slit ST2, for example, by an atomic layer deposition (ALD) method, so that the conductive layer WL is formed as illustrated in FIG. 7D. As described above, the staircase portion FS having steps different by one step each on both sides of the second slit ST2, described above with reference to FIGS. 5 and 6, is obtained.

Note that the etching solution injected into the first slit ST1 also removes the silicon nitride layer exposed to the inner surface of the first slit ST1, so that the space is generated on both sides of the first slit ST1. The space is also filled with a metal and becomes a conductive layer continuous with the corresponding conductive layer WL in the staircase portion FS. However, unlike the second slit ST2, since the first slit ST1 has no gap G, the conductive layer WL is not continuous on both sides of the first slit ST1. That is, one memory block is defined by the two adjacent first slits ST1.

The etching solution is also injected into the third slit ST3. However, since a film having resistance to the etching solution, such as silicon oxide, is formed on the inner surface of the third slit ST3 as described above, the silicon nitride layer SN is not removed. Therefore, as illustrated in FIGS. 5 and 6, the stacked body ON in which the silicon oxide layer OL and the silicon nitride layer SN are alternately stacked one by one remains between the two adjacent third slits ST3.

Hereinafter, effects obtained by the second slits ST2 arranged along the X-axis direction with the gap G therebetween will be described. As described above, the conductive layer WL is continuous through the gap G on both sides of the second slit ST2. That is, the stacked body SK in which the silicon oxide layer OL and the conductive layer WL are alternately stacked one by one is formed in the gap G of the second slit ST2.

Here, for example, as illustrated in FIG. 5, in a portion where the second slit ST2 is present, the second slit ST2 is sandwiched by the stacked body SK. As described above, the second slit ST2 is used when a metal is filled in the space SP formed by removing the silicon nitride layer SN, and remains as a cavity when the metal filling is completed. In this case, the stacked body SK may be inclined toward the cavity. In addition, even after an insulating material such as silicon oxide is filled in the second slit ST2, stress may act between the second slit ST2 and the stacked body SK on both sides, and deformation may occur. Furthermore, as illustrated in FIG. 5, the interlayer insulating film SO is formed above the conductive layer WL as a step surface to which the contact CC is connected. The thickness of the interlayer insulating film SO is also different depending on the height of the step of the staircase portion FS, and is also different on both sides of the second slit ST2. Due to such a difference, stress may occur and deformation may occur.

However, in the semiconductor memory device 1 according to the present embodiment, it is possible to reduce inclination of the stacked body SK connected on both sides of the second slit ST2 in the gap G toward the second slit ST2 as a cavity or application of stress to the second slit ST2 filled with an insulating material. In other words, the stacked body SK of the gap G can function as a beam supporting the stacked body SK on both sides of the second slit ST2.

Note that the example in which the gap G of the second slit ST2 is located in the conductive layer WL from the uppermost step to the lowermost step of the stacked body SK has been described with reference to FIGS. 3 and 6. In this example, since the stacked body SK occupies substantially the entire portion in the Z-axis direction which is the height direction of the gap G, the function as the beam is further exhibited. However, the stacked body is not limited to this position, and the function as the beam can be exhibited even if the stacked body is provided so as to correspond to another step.

In addition, the conductive layer WL of the stacked body SK is continuous on both sides of the second slit ST2 through the gap G of the second slit ST2. For this reason, when each step of the staircase portion FS is formed so as to be different by one step each on both sides of the second slit ST2 and then the contact CC is connected to the step surface on one side of the second slit ST2, the contact CC is also electrically connected to the conductive layer WL on the other side of the second slit ST2.

If there is no gap G and the conductive layer WL is not continuous on both sides of the second slit ST2, it is not possible to form a staircase portion in which steps are different by one step each on both sides. In this case, the number of steps of the staircase should be increased, and the contacts should be disposed in a line. Assuming that there are 16 conductive layers WL, the staircase portion also has 16 steps, and 16 contacts need to be arranged in a line.

On the other hand, according to the semiconductor memory device 1 according to the present embodiment, since it is possible to form the staircase portion FS having steps different by one step each on both sides of the second slit ST2, it is possible to arrange eight contacts CC in one line in two lines. Therefore, the staircase portion FS can be shortened, and the semiconductor memory device 1 can be downsized.

However, the number of conductive layers WL, that is, the number of stacked layers of the stacked body SK is not limited to the illustrated example, and may be arbitrarily determined. In addition, it is possible to increase the number of memory cells, that is, increase the storage capacity by stacking the stacked bodies SK illustrated in the accompanying drawings in a plurality of steps to form higher memory pillars PL. For example, 48 or 64 conductive layers can be formed.

(First Modification)

Next, a semiconductor memory device according to a first modification of the present embodiment will be described. In the first modification, a configuration capable of preventing deformation due to stress is provided in the through contact region AC4Y described mainly with reference to FIG. 2B. Other structures are similar to those of the semiconductor memory device 1 according to the embodiment.

Note that the configuration described below may be applied to the through contact region AC4X described with reference to FIG. 2A.

Figure 8A:
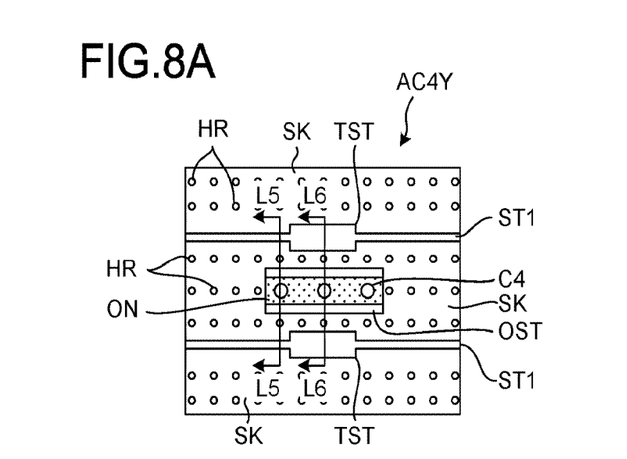
FIG. 8A is a top view schematically illustrating a through contact region of a semiconductor memory device according to a first modification of the present embodiment.

FIG. 8A is a top view schematically illustrating the through contact region AC4Y in the semiconductor memory device according to the first modification of the present embodiment. In FIG. 8A, unlike FIG. 2B, the cell region CA is omitted. In addition, FIG. 8A illustrates a plurality of columnar bodies (second columnar bodies) HR. The columnar body HR penetrates the stacked body SK in the stacking direction thereof, and an inner portion thereof is filled with an insulating material such as silicon oxide. The columnar body HR is used to support the silicon oxide layer OL and maintain the space SP, when the silicon nitride layer SN of the stacked body ON is removed as described above. Therefore, a predetermined number of columnar bodies HR may be disposed in a predetermined pattern in the stacked body SK. Further, the columnar body HR is formed in the semiconductor memory device 1 according to the first embodiment as well as the present modification, but illustration is not omitted.

As illustrated in FIG. 8A, in the present modification, the through contact region AC4Y has a stacked body SK and a stacked body ON sandwiched between two short slits OST. In the stacked body ON, the through contact C4 penetrating the stacked body ON is disposed along the stacking direction. In addition, the width of the first slit ST1 increases at a part facing the short slit OST. In the following description, for convenience, the portion having a large width is referred to as a widening slit (widening portion) TST.

Figure 8B:
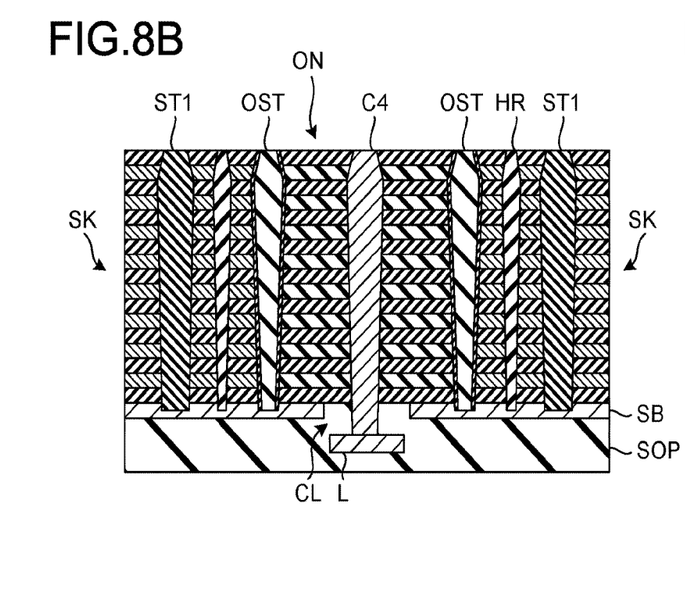
FIG. 8B is a cross-sectional view taken along the line L5-L5 in FIG. 8A.

FIG. 8B is a cross-sectional view taken along the line L5-L5 in FIG. 8A; The stacked body ON is formed between the two short slits OST, that is, inside the two short slits OST, and the through contact C4 is provided so as to penetrate the stacked body ON. The through contact C4 is connected to the wiring L formed in the multilayer wiring portion ML in the silicon oxide film SOP at the lower end. Although not illustrated in FIG. 8B, the through contact C4 is connected to the upper layer wiring UL at the upper end via the plug C4P as illustrated in FIG. 5.

The stacked body SK is formed outside the short slit OST, and the columnar body HR and the first slit ST1 are formed so as to penetrate the stacked body SK and reach the base layer SB. As described above, the through contact C4 is formed of a metal such as tungsten or molybdenum, and the columnar body HR and the first slit ST1 are formed of an insulating material such as silicon oxide. In addition, the short slit OST is also formed of an insulating material such as silicon oxide. However, the short slit OST is different from the columnar body HR and the first slit ST1 in that a liner layer is provided as described later.

Figure 8C:
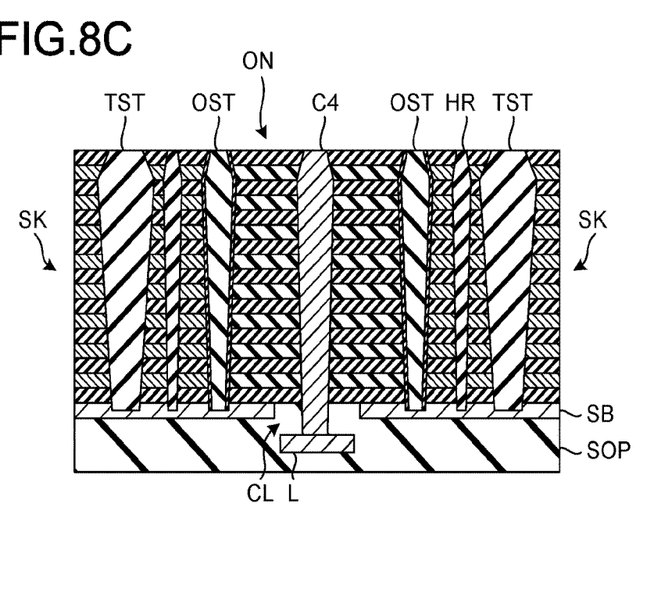
FIG. 8C is a cross-sectional view taken along the line L6-L6 in FIG. 8A.

FIG. 8C is a cross-sectional view taken along the line L6-L6 in FIG. 8A; Since the line L6-L6 crosses the widening slit TST, a cross section of the widening slit TST is illustrated in FIG. 8C. As clear from the comparison with FIG. 8B, the widening slit TST has a width larger than that of the first slit ST1. The effects exhibited by the widening slit TST will be described later.

In addition, in the illustrated example, the base layer SB has a separation portion CL, and in the separation portion CL, the top surface of the silicon oxide film SOP is matched with the top surface of the base layer SB. The through contact C4 is disposed so as to pass through the separation portion CL, so that the through contact C4 is insulated not only from the stacked body SK but also from the base layer SB.

Next, a method for forming the through contact region AC4Y in the semiconductor memory device according to the first modification of the present embodiment will be described with reference to FIGS. 9A to 11. FIGS. 9A to 11 are diagrams illustrating the method for forming the through contact region AC4Y in the semiconductor memory device according to the first modification of the present embodiment. In FIGS. 9A to 11, the left side is a top view and corresponds to FIG. 8A, and the right side is a cross-sectional view and corresponds to FIG. 8B. For convenience, the line L5-L5 is illustrated in FIGS. 9B to 11, similarly to FIG. 8A.

Figure 9A:
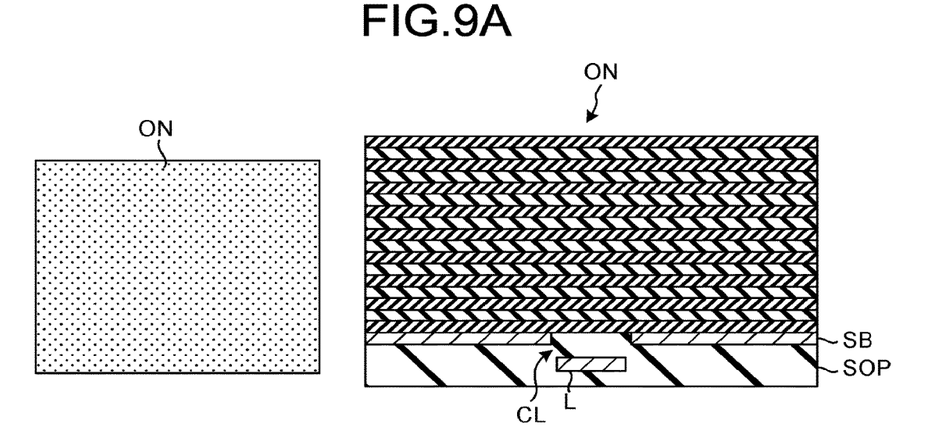
FIGS. 9A to 9C are diagrams illustrating a method for forming the through contact region of the semiconductor memory device according to the first modification of the present embodiment.

Referring to FIG. 9A, the base layer SB is formed on the silicon oxide film SOP on which the peripheral circuit unit PER is formed, and the stacked body ON in which a plurality of silicon oxide layers OL and a plurality of silicon nitride layers SN are alternately stacked one by one is formed on the base layer SB. When the stacked body ON is formed, for example, a chemical vapor deposition (CVD) method is used.

Figure 9B:
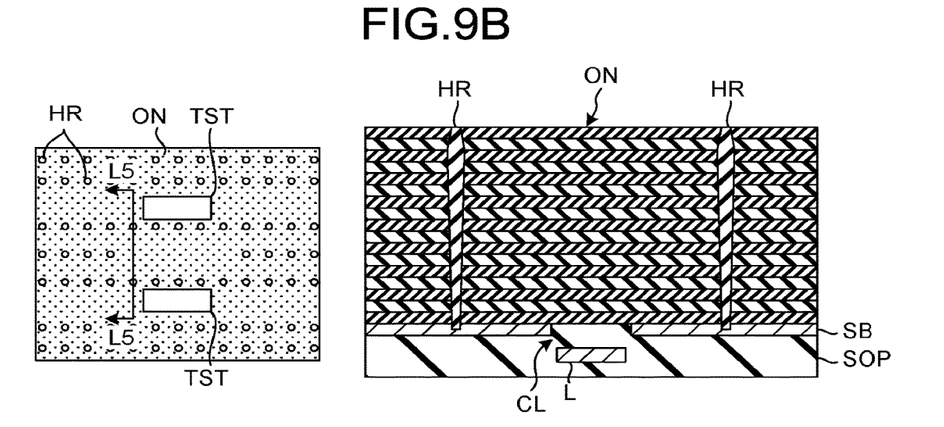

Next, as illustrated in FIG. 9B, the columnar body HR and the widening slit TST are formed by a series of processes such as photolithography, etching, and thin film deposition. Specifically, an etching mask having an opening at a position where the columnar body HR and the widening slit TST are to be formed is formed, and holes for the columnar body HR and holes for the widening slit TST are formed by, for example, a reactive ion etching (RIE) method using the etching mask. These holes penetrate the stacked body ON and reach the base layer SB to be an underlayer. Thereafter, these holes are filled with an insulating material such as silicon oxide by, for example, a CVD method, and the columnar body HR and the widening slit TST are formed. Here, the widening slit TST is formed at a position facing the short slit (second plate-like portion) OST formed in a later process.

Figure 9C:
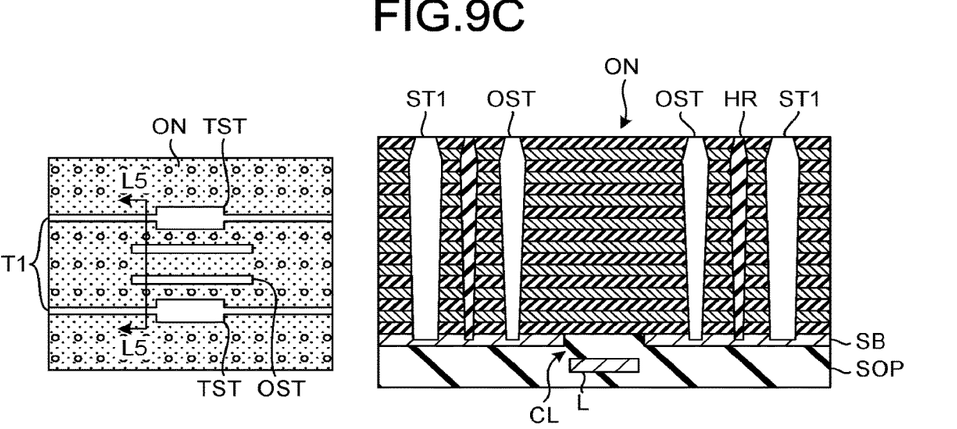
Figure 10A:
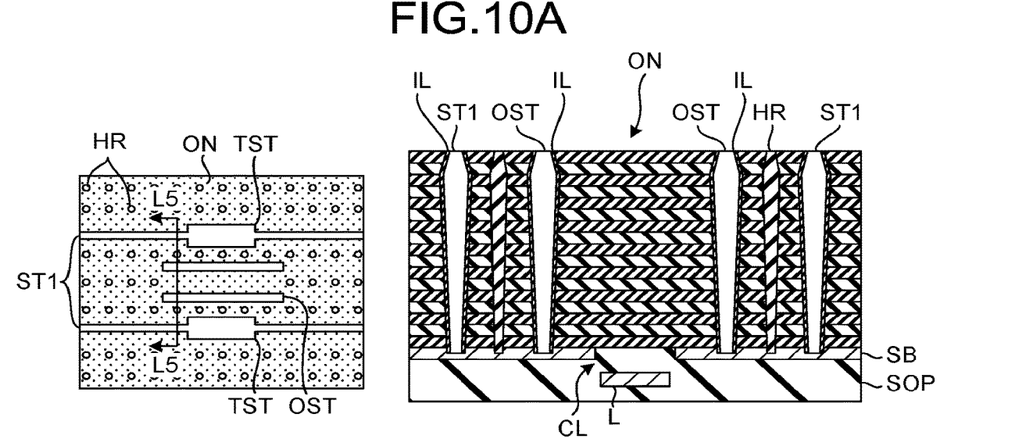
FIGS. 10A to 10C are diagrams illustrating the method for forming the through contact region of the semiconductor memory device according to the first modification of the present embodiment, following FIG. 9C.
Figure 10B:
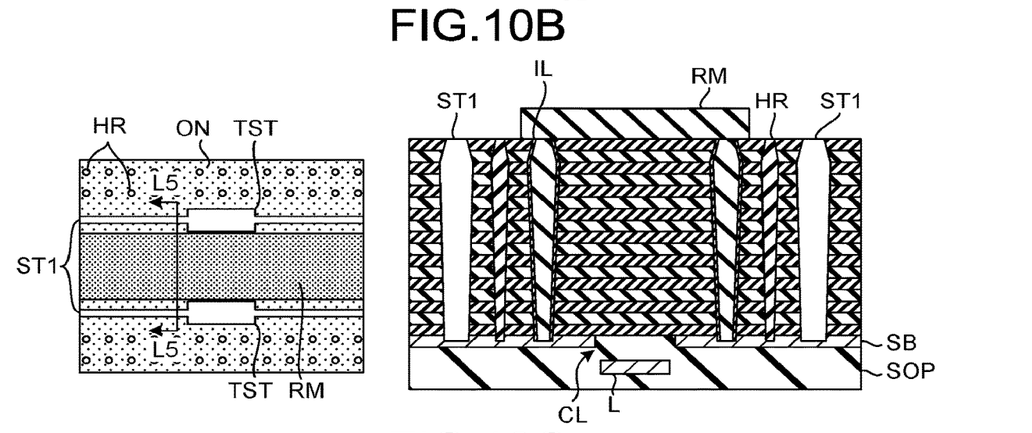

Next, as illustrated in FIG. 9C, the first slit ST1 and the short slit OST are formed. Here, the first slit ST1 is formed so as to be continuous with the widening slit TST formed in advance. Subsequently, as illustrated in FIG. 10A, a liner layer IL is formed on the inner surface of the first slit ST1 and the inner surface of the short slit OST. As will be described later, the liner layer IL is formed of an insulator having resistance to an etching solution for silicon nitride, for example, silicon oxide. Thereafter, as illustrated in FIG. 10B, the short slit OST is covered with a resist mask RM, and etching is performed by the RIE method using the resist mask RM. As a result, the liner layer IL remains in the short slit OST covered with the resist mask RM, and the stacked body ON is exposed to the inner surface of the first slit ST1.

Figure 10C:
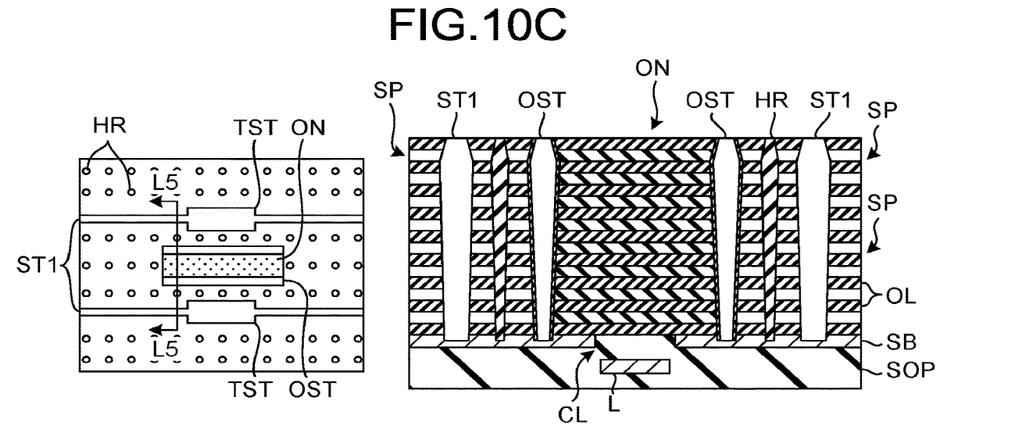

Next, when an etching solution such as phosphoric acid is injected into the first slit ST1, as illustrated in FIG. 10C, the silicon nitride layer SN exposed to the inner surface of the first slit ST1 is etched to form the space SP. Here, the silicon oxide layer OL is supported by the columnar body HR, and the space SP is maintained. Although the etching solution is also injected into the short slit OST, the liner layer IL is formed on the inner surface of the short slit OST, so that the silicon nitride layer SN is not etched. As a result, the stacked body ON remains between the short slits OST.

Figure 11:
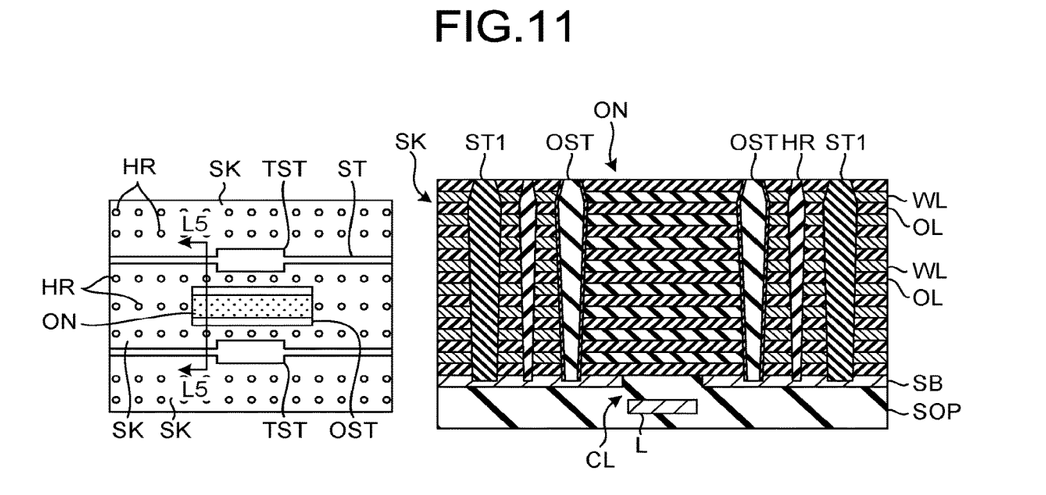
FIG. 11 is a diagram illustrating the method for forming the through contact region of the semiconductor memory device according to the first modification of the present embodiment, following FIG. 10C.

Next, when the space SP is filled with a metal such as tungsten or molybdenum through the first slit ST1 by, for example, an atomic layer deposition (ALD) method, a region outside the two short slits OST becomes the stacked body SK as illustrated in FIG. 11. Thereafter, the through contact C4 that penetrates a part of the stacked body ON and the silicon oxide film SOP and reaches the wiring L is formed, and the structure described with reference to FIGS. 8A to 8C is obtained.

In the above-described structure, the stacked body ON and the short slit OST are surrounded by the stacked body SK. The stacked body ON is formed of the silicon oxide layer OL and the silicon nitride layer SN, while the stacked body SK around the stacked body ON is formed of the silicon oxide layer OL and the conductive layer WL. Therefore, stress can act between the stacked body ON and the stacked body SK. In particular, immediately after the stacked body SK is formed, the short slit OST is a cavity, so that there is a possibility that a force inclining the stacked body SK toward the stacked body ON acts on the stacked body SK. However, in the present modification, since the widening slit TST having a width larger than the width of the first slit ST1 is formed on both sides of the stacked body ON, the force can be reduced. Therefore, deformation of the stacked bodies SK and ON can also be reduced. As a result, according to the first modification, it is possible to prevent deformation due to stress even in the through contact region AC4Y.

(Second Modification)

Figure 12:
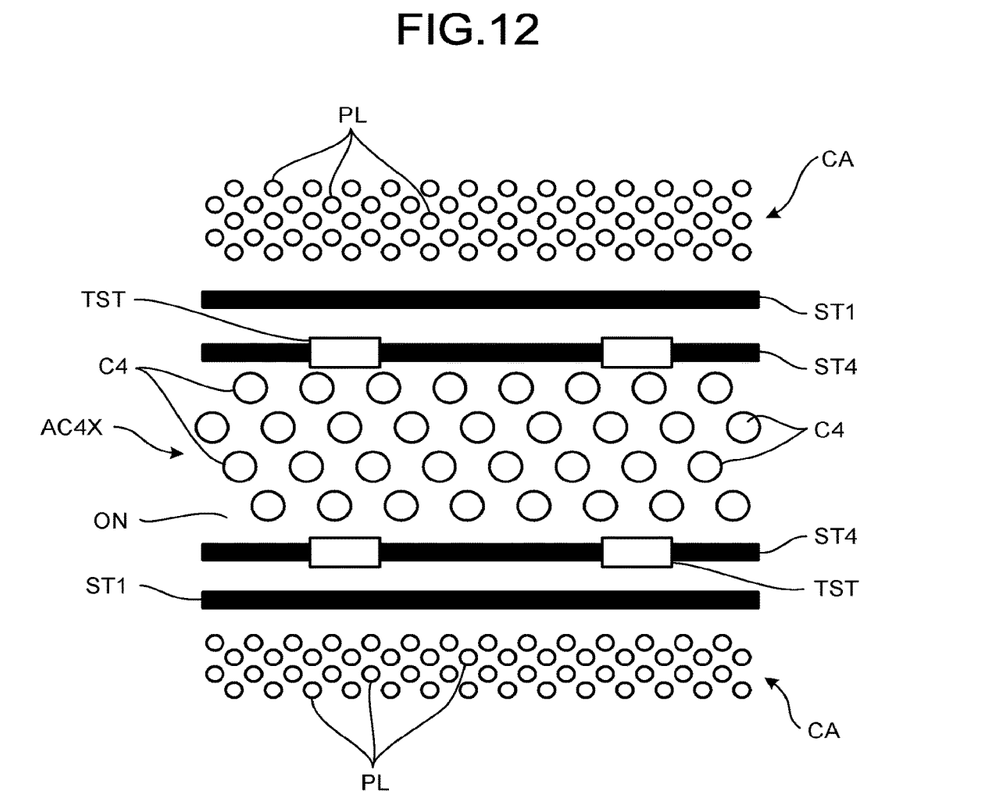
FIG. 12 is a top view schematically illustrating a through contact region of a semiconductor memory device according to a second modification of the present embodiment.

Next, a semiconductor memory device according to a second modification of the present embodiment will be described. FIG. 12 is a top view schematically illustrating a through contact region AC4X of the semiconductor memory device according to the second modification.

In the second modification, a fourth slit (second plate-like portion) ST4 is provided in the through contact region AC4X along the first slit ST1 dividing the cell region CA and the through contact region AC4X. The fourth slit ST4 has a function similar to that of the short slit OST in the first modification. That is, the stacked body ON remains in a region sandwiched between two fourth slits ST4, that is, inside the two fourth slits ST4. Further, the fourth slit ST4 is provided with widening slits TST at predetermined intervals. Therefore, the stress that causes the stacked body SK in the cell region CA to be inclined toward the stacked body ON can be reduced by the widening slit TST. As a result, according to the second modification, it is possible to prevent deformation due to stress even in the through contact region AC4X.

(Other Modifications)

In the above-described embodiment, first modification, and second modification, the staircase portion FS is formed by processing the end portion of the stacked body SK extending from the cell region CA into a staircase shape so that the conductive layer WL becomes a step surface. However, the staircase portion FS may have a staircase shape having the insulating layer OL, which is, for example, a silicon oxide layer or the like in the stacked body SK, as a step surface. In this case, the contact CC can penetrate the interlayer insulating film SO and the insulating layer OL as a step surface and can be connected to the conductive layer WL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body in which a plurality of conductive layers and a plurality of insulating layers are alternately stacked one by one;
a plurality of first plate-like portions that penetrate the stacked body in a stacking direction of the stacked body and cross the stacked body in a first direction intersecting the stacking direction, the plurality of first plate-like portions being arranged along the first direction with a gap therebetween;
an insulating portion that is surrounded by the stacked body;
a conductor portion that penetrates the insulating portion in the stacking direction; and
a second plate-like portion that penetrates a boundary portion between the stacked body and the insulating portion on the side facing the plurality of first plate-like portions in the stacking direction and crosses the boundary portion in the first direction.

2. The semiconductor memory device according to claim 1, wherein
each of the plurality of conductive layers is connected on both sides of the plurality of first plate-like portions through the gap in a second direction intersecting the stacking direction and the first direction.

3. The semiconductor memory device according to claim 1, further comprising:
a staircase structure which extends in the first direction and in which each of the plurality of conductive layers or each of the plurality of insulating layers becomes a step surface, on both sides of at least one of the plurality of first plate-like portions, wherein
the step surfaces of the staircase structure are different by one step each on both sides of the at least one first plate-like portion.

4. The semiconductor memory device according to claim 1, further comprising:
a first columnar body that penetrates the stacked body in the stacking direction of the stacked body, the first columnar body having a memory cell at a contact portion between the first columnar body and the conductive layer.

5. A method for manufacturing a semiconductor memory device, comprising:
forming a stacked body in which a plurality of conductive layers and a plurality of insulating layers are alternately stacked one by one;
forming a plurality of first plate-like portions penetrating the stacked body in a stacking direction of the stacked body and crossing the stacked body in a first direction intersecting the stacking direction so as to be arranged along the first direction with a gap therebetween;
forming an insulating portion surrounded by the stacked body;
forming a conductor portion penetrating the insulating portion in the stacking direction; and
forming a second plate-like portion that penetrates a boundary portion between the stacked body and the insulating portion on the side facing the plurality of first plate-like portions in the stacking direction and crosses the boundary portion in the first direction.

6. The method for manufacturing a semiconductor memory device according to claim 5, wherein the formation of the stacked body includes:
alternately stacking a plurality of sacrificial layers and the plurality of insulating layers one by one and replacing the plurality of sacrificial layers with the plurality of conductive layers.

7. The method for manufacturing a semiconductor memory device according to claim 6, wherein
the formation of the plurality of first plate-like portions includes:
forming a plurality of slits penetrating the plurality of sacrificial layers and the plurality of insulating layers; and
forming insulators in the slits to form the plurality of first plate-like portions, and
the formation of the stacked body includes:
replacing the plurality of sacrificial layers with the plurality of conductive layers through the plurality of slits.

8. The method for manufacturing a semiconductor memory device according to claim 6, further comprising:
forming an insulating portion surrounded by the stacked body;
forming a conductor portion penetrating the insulating portion in the stacking direction; and
forming a second plate-like portion that penetrates a boundary portion between the stacked body and the insulating portion on the side facing the plurality of first plate-like portions in the stacking direction and crosses the boundary portion in the first direction, wherein
the formation of the insulating portion includes:
inhibiting replacement of the plurality of sacrificial layers with the plurality of conductive layers in a partial region by the second plate-like portion to form the insulating portion in which the plurality of sacrificial layers and the plurality of insulating layers are alternately stacked one by one.

9. The method for manufacturing a semiconductor memory device according to claim 5, further comprising:
forming a staircase structure which extends in the first direction and in which each of the plurality of conductive layers or each of the plurality of insulating layers becomes a step surface, on both sides of at least one of the plurality of first plate-like portions, the step surfaces of the staircase structure being caused to be different by one step each on both sides of the at least one first plate-like portion.

* * * * *